United States Patent
Eggum

(10) Patent No.: US 6,848,578 B2
(45) Date of Patent: Feb. 1, 2005

(54) WAFER ENCLOSURE SEALING ARRANGEMENT FOR WAFER CONTAINERS

(75) Inventor: Shawn D. Eggum, Lonsdale, MN (US)

(73) Assignee: Entegris, Inc., Chaska, MN (US)

(*) Notice: Subject to any disclaimer, the term of this patent is extended or adjusted under 35 U.S.C. 154(b) by 14 days.

(21) Appl. No.: 10/293,891

(22) Filed: Nov. 13, 2002

(65) Prior Publication Data

US 2003/0106831 A1 Jun. 12, 2003

Related U.S. Application Data

(60) Provisional application No. 60/332,972, filed on Nov. 14, 2001.

(51) Int. Cl.$^7$ .............................................. B65D 85/48
(52) U.S. Cl. ...................................... 206/454; 206/710
(58) Field of Search ................................ 206/710, 711, 206/454, 712; 220/378, 806, 304; 277/641, 642, 644, 647, 626, 645, 649, 639

(56) References Cited

U.S. PATENT DOCUMENTS

| | | | | |
|---|---|---|---|---|
| 4,658,847 A | * | 4/1987 | McCrone | 277/630 |
| 5,390,811 A | | 2/1995 | Ogino et al. | |
| 5,476,176 A | | 12/1995 | Gregerson et al. | |
| 5,586,658 A | | 12/1996 | Nyseth | |
| 5,611,452 A | * | 3/1997 | Bonora et al. | 220/378 |
| 5,971,191 A | * | 10/1999 | Yamada et al. | 220/378 |
| 5,988,392 A | | 11/1999 | Hosoi | |
| 5,988,423 A | * | 11/1999 | Auzureau | 220/233 |
| 5,992,638 A | | 11/1999 | Gregerson et al. | |
| 6,010,008 A | | 1/2000 | Nyseth et al. | |
| 6,098,809 A | | 8/2000 | Okada et al. | |
| 6,105,781 A | * | 8/2000 | Ejima et al. | 206/710 |
| 6,202,887 B1 | | 3/2001 | Petit | |
| 6,206,196 B1 | | 3/2001 | Krampotich et al. | |
| 6,273,261 B1 | | 8/2001 | Hosoi | |
| 6,354,601 B1 | * | 3/2002 | Krampotich et al. | 277/628 |
| 6,494,338 B1 | * | 12/2002 | Schultz | 220/328 |
| 6,523,833 B1 | * | 2/2003 | Ishigaki et al. | 277/650 |
| 6,623,014 B1 | * | 9/2003 | Martin | 277/630 |
| 6,629,537 B2 | * | 10/2003 | Gueret | 132/299 |

* cited by examiner

*Primary Examiner*—Shian T. Luong
(74) *Attorney, Agent, or Firm*—Patterson, Thuente, Skaar & Christensen, P.A.

(57) ABSTRACT

A wafer container comprises a housing with a door frame, defining an opening for insertion and removal of wafers, and a door for insertion into the door frame. The door includes a wafer enclosure sealing arrangement for hermetically sealing the door with the door frame of the housing. The wafer enclosure sealing arrangement includes a first groove disposed about a perimeter of the interior surface of the door and a second groove disposed adjacent to the first groove and spaced laterally from the perimeter of the door. The sealing arrangement includes a support member disposed between the first and second grooves. The sealing arrangement also includes an elastomeric seal member having a first portion that is frictionally inserted into the second groove and extends around the door and a second portion that cantilevers downward into the second groove when the door and housing are joined.

20 Claims, 3 Drawing Sheets

WAFER ENCLOSURE SEALING ARRANGEMENT FOR WAFER CONTAINERS

This application claims priority to Provisional Application No. 60/332,972 filed Nov. 14, 2001.

FIELD OF THE INVENTION

The present invention generally relates to enclosures. More particularly, the present invention relates to sealable enclosures for holding wafers being processed in a semiconductor processing facility.

BACKGROUND OF THE INVENTION

Semiconductor wafers are subjected to numerous steps during processing. Wafer processing usually entails transporting a plurality of wafers from one workstation to another for processing by specialized equipment. As part of the processing procedure, wafers may be temporarily stored or shipped in containers to other plants or to end-users. Movement of wafers through various environments may expose the wafers to potential wafer damaging contaminants. In order to shield the wafers from exposure to deleterious contaminants, the wafers are housed in specialized containers that not only isolate the wafers from exterior contaminants but also minimize the generation of contaminants. A common feature of these containers includes a removable door or closure which seal or are sealed, such as by tape, when closed.

As the number of circuits per unit area has increased in semiconductor wafers, each circuit has correspondingly decreased in size making contaminants in the form particulates more problematic. The size of particulates that can destroy a circuit has decreased and is approaching the molecular level. Particulate control is necessary during all phases of manufacturing, processing, transporting and storage of semiconductor wafers. The industry is moving toward processing larger and larger wafers into semiconductors. Three hundred millimeter (300 mm) wafers are now commonplace.

Wafer carriers may be made of a variety of materials, which in almost all cases comprises thermoplastics. Early containers including, enclosures and closures, were made of highly moldable plastics such as polyethelene, see U.S. Pat. No. 4,248,346. Other containers held rigid h-bar carriers such as disclosed in U.S. Pat. No. 5,273,159, while others comprised polycarbonate enclosure portions with molded in slots and softer, more resilient covers. See for example U.S. Pat. No. 5,586,658.

Most wafer containers used within semiconductor fabrication facilities have a seal interposed between the door and the housing of the wafer container. In addition, the wafer container is capable of being sealingly engaged with the processing equipment. These wafer containers are generally known as "SMIF" pods (sealed mechanical interface) or transport modules because the door closes an open bottom of the container or housing. These containers must conform to rigid structural and performance requirements because of their constant exposure to rigorous operating conditions. Further, they must be mechanically latchable by robotic or manual means and must provide exceptional isolation, such as being hermetically sealable, upon simply closing the door.

Containers used in semiconductor processing facilities for 300 mm wafers typically use front opening modules. A conventional seal for both SMIF pods and transport modules have been relatively simple elastomeric seals that are simply compressed between the door and the housing in an axial direction to provide the seal. With this approach, the polycarbonate of the housing portion that contacts the elastomeric seal may at times adhere to the seal and inadvertently damage the seal. The constant opening and closing of the door may move the seal out of position and introduce a protruding or dangling portion of the seal that can inadvertently catch a piece of processing equipment, causing catastrophic wafer breakages or can render the container unsealable.

Accordingly, a sealing arrangement is needed for wafer enclosures that enhances the hermetic seal of the wafer enclosure and inhibits movement of the elastomeric seal. A wafer enclosure sealing arrangement that addresses the aforementioned problems, as well as other related problems, is therefore desirable.

SUMMARY OF THE INVENTION

A wafer container comprises a housing with a door frame, defining an opening for insertion and removal of wafers, and a door for insertion into the door frame. The door includes a wafer enclosure sealing arrangement for hermetically sealing the door with the door frame of the housing.

According to one aspect of the invention, a wafer enclosure sealing arrangement is incorporated in a door of a wafer enclosure having a housing, with a portion of an interior surface of the door being in contact with a housing upon sealing the wafer enclosure. The wafer enclosure sealing arrangement includes a first groove disposed about a perimeter of the interior surface of the door and a second groove disposed adjacent to the first groove and spaced laterally from the perimeter of the door. The wafer sealing arrangement includes a support member disposed between the first and second grooves. The wafer sealing arrangement also includes an elastomeric seal member having a first portion that is frictionally inserted into the second groove and extends around the door. The elastomeric seal member also includes a second portion that is disposed over the support member and over the first groove, wherein the second portion of the seal member is deflected into the first groove upon sealing the wafer enclosure housing with the door.

In a preferred embodiment, the support member of the wafer enclosure sealing arrangement includes a plurality of posts that engage with a plurality of corresponding apertures in the seal member such that lateral movement of the seal member is inhibited. In this example embodiment, the seal member is L-shaped with the second portion of the seal member configured to be longer than (e.g., elongated) the first portion of the seal member and configured to move in cantilever fashion.

In a preferred embodiment the second cantilevered portion of the seal member has a unflexed "normal" position and the door has a perimeter flange that extends around the perimeter. The perimeter flange is positioned approximately at the tip of the second cantilevered member thereby providing protection and isolation of said second cantilevered member. The perimeter flange also may provide an engagement surface between the door and housing.

An object and advantage of the invention is that the seal member (or gasket) is securely captured on the door perimeter effectively preventing inadvertent dislocation.

An object and advantage of preferred embodiments of the invention is that the wafer enclosure sealing arrangement inhibits lateral movement of an elastomeric seal member beyond a perimeter of the door.

A further object and advantage of particular embodiments of the invention is that the wafer enclosure sealing arrangement inhibits inadvertent adherence between the seal member and the door frame of the wafer enclosure housing upon removing the door.

A further object and advantage of preferred embodiments of the invention is that the seal can be easily replaced when it breaks or at the end of its useful life due to fatigue.

DESCRIPTION OF THE PREFERRED EMBODIMENT

Figure 1:
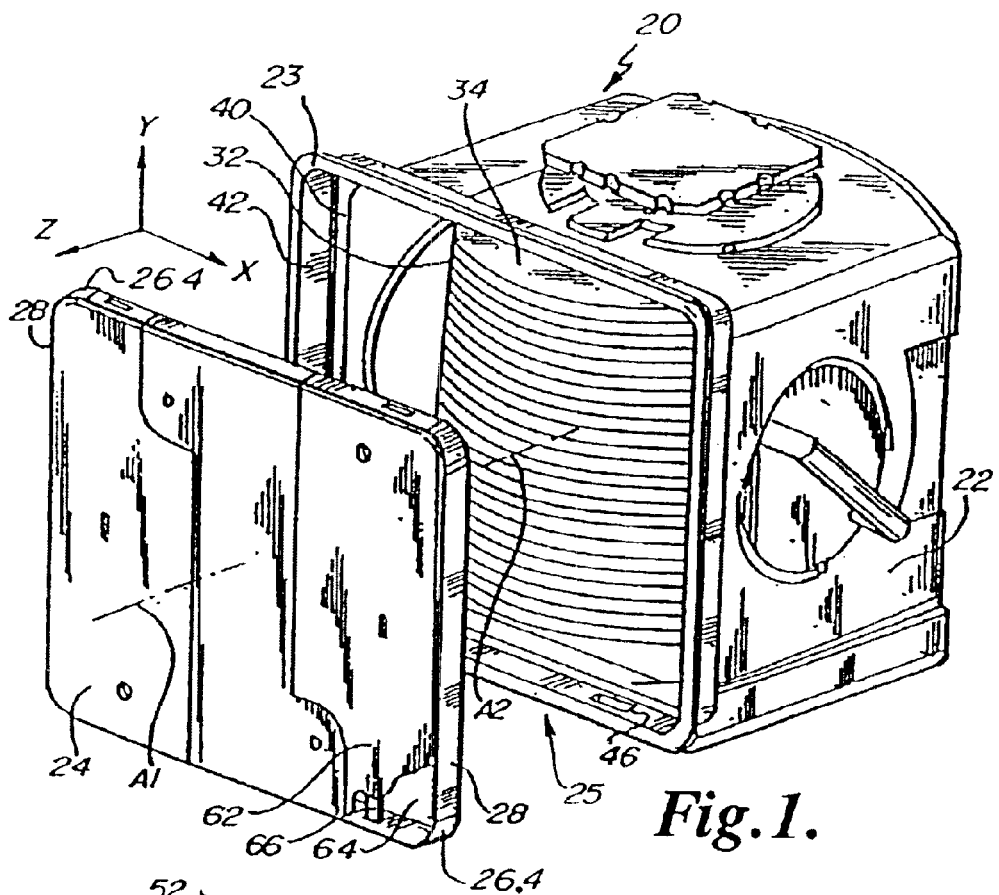
FIG. 1 is a perspective view of a wafer carrier or enclosure embodying the present invention.

FIG. 1 illustrates a prior art front opening transport module 20 that is appropriate for use with or as part of the instant invention. "Transport module" is a generic term for a semiconductor wafer or reticle enclosure (or container) used for transporting, storing and/or shipping wafers and reticules. In this example, wafer enclosure 20 is generally comprised of a housing 22 having a door frame 23 defining a front opening 25 for insertion and removal of wafers from the housing. Housing 22 includes a plurality of slots 32 for locating wafers 34 for containment during transportation or storage. Door frame 23 is configured as a flanged structure shape for receiving door 24 and includes a sealing surface 40, walls 42 and latch receivers 46. When used herein, the door frame should not be limited to include a separate structure from the enclosure portion nor additional structure on or integral with the enclosure. Rather, the door frame is hereby defined to be the portion of housing 22 that receives door 24. The x-y-z coordinate axes are illustrated for ease of explanation. The door as well as wafers are inserted and removed from the door along the z axis. The y axis is vertical and the x axis extends laterally.

Figure 2:
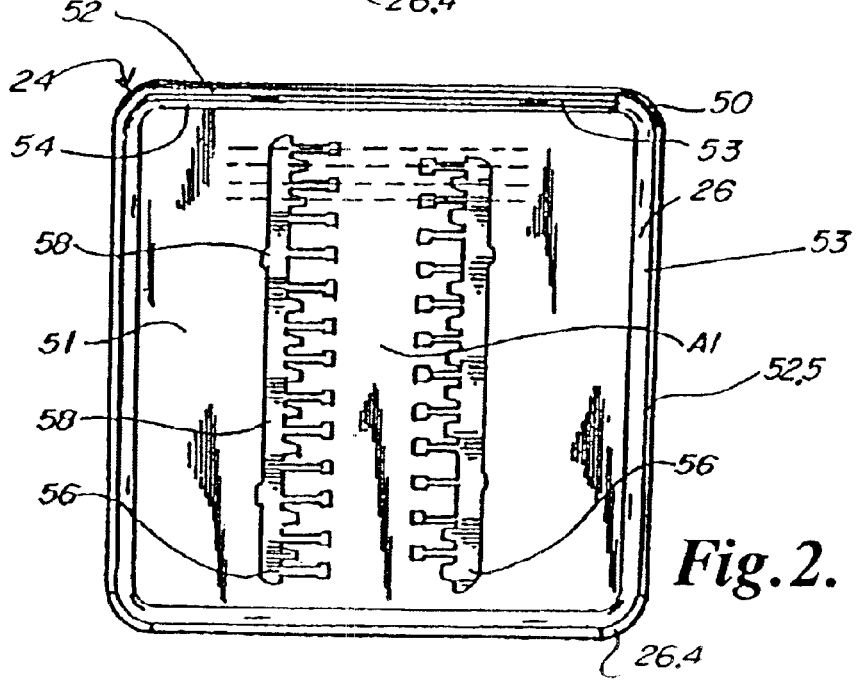
FIG. 2 is an inside elevational view of a wafer enclosure door generally illustrating part of an example embodiment of the wafer enclosure sealing arrangement of the present invention.

Referring now to FIG. 2, door 24 generally comprises an interior wall 51 having an exterior surface 62 and a circumferential surface 28 which makes contact with door frame 23 when wafer container 20 is sealed. Door 24 also includes a seal member 26 which extends around a perimeter of door 24 and is adjacent the circumferential surface of door 24. Seal member 26 operates to sealingly engage housing 22 when container 20 is closed.

Door 24 has an axis A1 and the closure portion has an axis A2. For proper insertion of the door into the door frame, axis A1 and A2 should be aligned. When the door is inserted into the door frame, the door thus moves in an axial direction. When "radial" is used herein, it is intended to refer to direction or orientations which are normal to the axis A1 or A2 and can also include, with reference to seal member 26, any directions which are normal to that particular portion of the seal member as opposed to a pure vector outwardly from the door axis. Seal member 26 may also be referred to as a sealing gasket.

Figure 3:
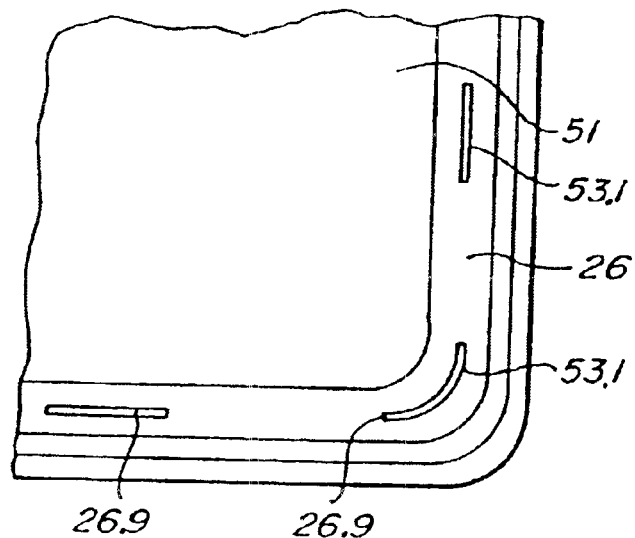
FIG. 3 is an elevational view of part of the wafer enclosure door illustrating an example embodiment of the wafer enclosure sealing arrangement of the present invention.
Figure 4:
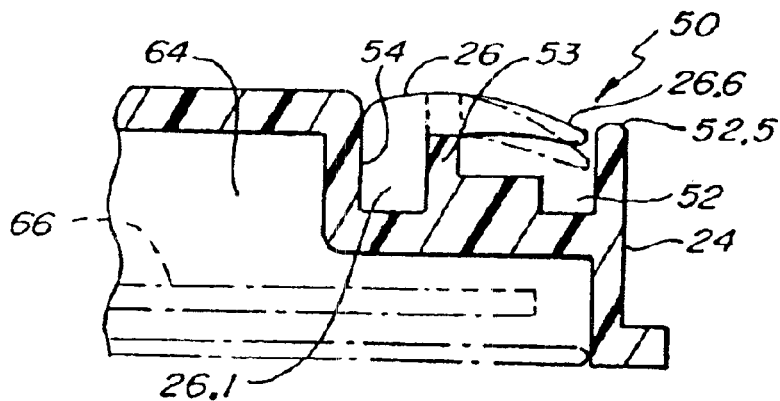
FIG. 4 is a cross sectional view of a portion of the wafer enclosure door that engages a seal member according to an example embodiment of the present invention.

Referring to FIGS. 2–4, door 24 includes a wafer enclosure sealing arrangement 50 disposed on interior surface 51 of the door. Door 24 further includes a set of wafer cushions 56 which provide a slightly biased constraint to the wafers when the door is in place. The cushions may be attached suitably at the connection points 58 with plastic snap-in connectors. The door enclosure portion may be configured such that the only contact between said components is the seal to door frame engagement and the door guide to door frame contact. Alternatively, supplemental stop portions may be provided in the enclosure portion to allow the door to bottom out when the seal is appropriately flexed. A portion of the exterior door panel 62 is removed in FIG. 1 to disclose the interior space 64 of the door as well as a portion of the latching mechanism 66. Said latching mechanism may operate as disclosed in U.S. Pat. No. 5,711,427 to David L. Nyseth and owned by the owner of the instant invention. Said patent for the purposes of full disclosure is incorporated herein.

Still referring again to FIGS. 2, 3, and 4, enclosure sealing arrangement 50 includes a first groove 52 defined by a perimeter flange 52.5 and an intermediate flange 53. The first groove is disposed about the perimeter of interior surface 51 of door 24. A second groove 54 is disposed adjacent to first groove 52 and is spaced further radially inward from the perimeter of the door. A support member, configured as flange 53 in this embodiment, is disposed between grooves 52 and 54. Sealing arrangement 50 further includes elastomeric seal member 26 having a first portion 26.1 that is frictionally inserted into second groove 54 that extends around the door. Seal member 26 also includes a second cantilevered portion 26.6 that is disposed over support member 53 and over first groove. Second cantilevered portion 26.6 of seal member 26 deflects downward into first groove 52 upon sealing housing 22 with door 24. With this approach, seal member 26 is inhibited from moving beyond the perimeter of door 24 and from getting caught with other processing equipment as container 20 is being moved from one location to another. In this example embodiment, second cantilevered portion 26.6 includes a surface 27 that is substantially coplanar with interior surface 51 of door 24. The width of seal member 26 may be about 0.530 inches.

Referring more particularly to FIGS. 2, 3 and 4, the figures illustrate an example embodiment of the wafer enclosure sealing arrangement of the present invention. In this example embodiment, support member 53 is comprised of a plurality of protruding members configured as posts 53.1 disposed between grooves 52 and 54 that protrude perpendicularly from interior surface 51. Posts 53.1 engage with and protrude through a plurality of corresponding apertures 26.9 in seal member 26 such that longitudinal or lateral movement of seal member 26 is effectively inhibited. Posts 53.1 and apertures 26.9 are disposed along the perimeter of door 24 (see FIG. 3). In this example embodiment, seal member 26 is L-shaped with second leg portion 26.6 of the seal member configured to be longer than first leg portion 26.1. In another example embodiment, posts 53.1 are flanges 53.1 that can engage corresponding slot apertures.

Figure 4A:
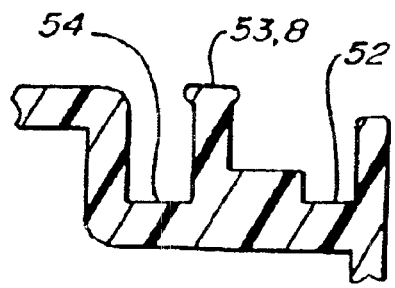
FIG. 4A is a cross sectional view of an alternative embodiment of the wafer enclosure door without a seal in place.

FIGS. 3 and 4 illustrate a portion of seal member 26 as viewed from the top and cross-section which includes first portion 26.1 and cantilevered portion 26.6 and seal member aperture 26.9. With respect to FIG. 4A there is illustrated a portion of door 24, without seal member 26, having first groove 52 and second groove 54 disposed inside of groove 52. In addition, elongate posts 53.1 are positioned along the interior of door 24 and adjacent the perimeter of the door.

Seal member 26 of the present invention provides cantilevered portion 26.6 which flexes, as illustrated by the dashed lines in FIG. 4, to accommodate housing 22 when the housing and door 24 are joined together. In this example embodiment, enclosure sealing arrangement 50 comprises first and second grooves 52 and 54, respectively, a support member 53 and seal member 26 which operate in combination to provide a hermetic seal between housing 22 and door 24. Enclosure sealing arrangement 50 allows for the door to be removed from housing 22 numerous times without the seal member being shifted from its position. Unlike other prior art designs, seal member 26 is not held on the perimeter of the door by circumferential tension which can lead to the seal member slipping off or breaking due to material fatigue. Seal member 26 is also recessed within door 24 in order to avoid shifting or stripping the seal member away from the door. In a related embodiment, seal member 26 can be placed on housing 22 along frame 23 as long as similar grooves 52 and 54 as well a support member 53 is included on the door frame to secure or engage seal member 26 and avoid stripping or slippage of the seal member.

Figure 5:
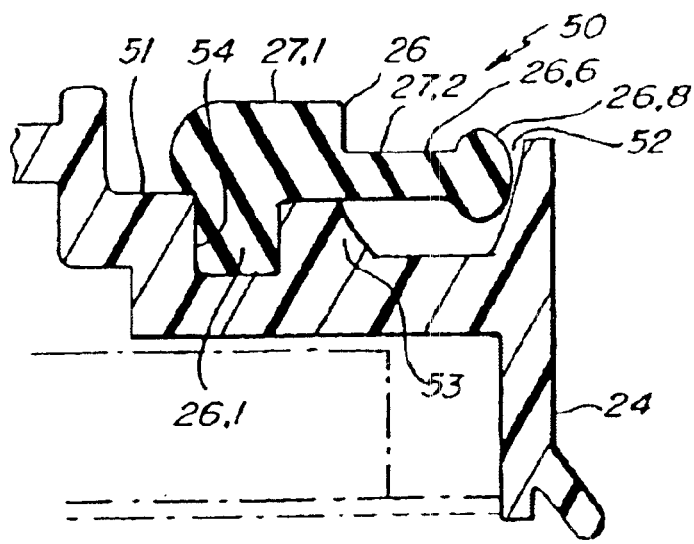
FIG. 5 is a cross sectional view of a further embodiment of a wafer enclosure door and seal member of the present invention.
Figure 6:
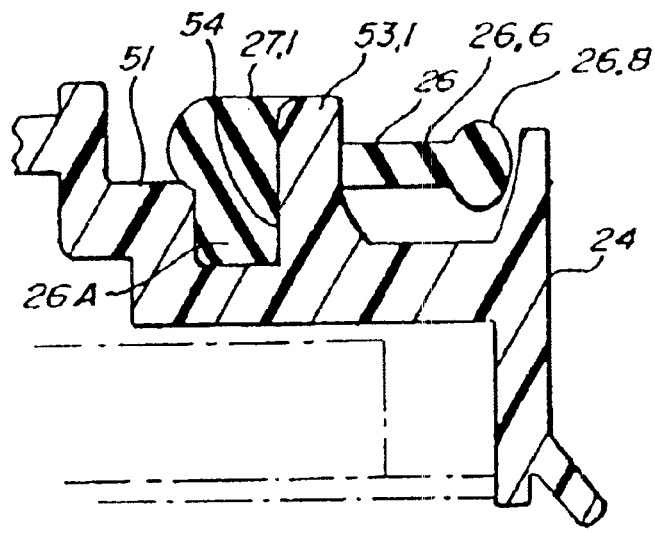
FIG. 6 is a cross-sectional view of the wafer enclosure door embodiment of FIG. 5 taken through a post.
Figure 7:
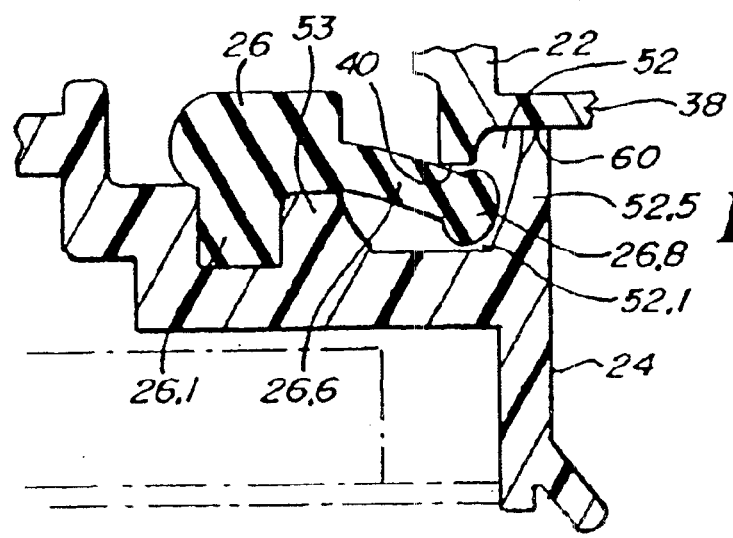
FIG. 7 is a cross-sectional view of the wafer enclosure door embodiment of FIG. 5 in engagement with a door.

Referring now to FIGS. 5, 6, and 7 another embodiment of enclosure sealing arrangement 50 is illustrated which includes seal member 26 having a substantially L-shaped configuration. In this example embodiment, first portion 26.1 is engaged in a groove 54 that is formed within door frame 24. For further structural support portion 26.1 includes a portion that protrudes in the direction of interior surface 51 as well as a two part upper surface 27.1 and 27.2 that not only provides additional structural strength but enhanced flexibility at cantilevered portion 26.6. Upper surface 27.1 is parallel with, but not coplanar with, upper surface 27.2. In this embodiment, cantilevered portion 26.6 also includes a head portion 26.8 that extends into or engages first groove 52 when the housing is fitted with door 24. With respect to FIG. 6B, this embodiment member 53.1 is shown as having a height that is coplanar with surface 27.1 of seal member 26. This example support member 53.1 provides lateral support for seal member 26.

FIG. 7 illustrates an example of a deflection of the second portion 26.6 of the seal member 26.9 when the door 24 is sealed in door frame 23 of housing 22. Note the tip or head portion 26.8 of the seal member may not contact the bottom 52.1 of the groove 52 before the door and door frame are stopped, such as at an interface 60.

In an example embodiment, the main structural components of wafer container 20, particularly the door frame, can be molded of rigid plastic such as polycarbonate. Similarly, the main structural portions of the door including grooves 52 and 54, support member 53 and flanges 53.1 can be molded from polycarbonate. The wafer cushions can suitably be formed of an abrasion resistant composite plastic such as polyetheretherketone (PEEK) and polytetrafluoroethylene (PTFE). Elastomeric seal member 26 can be formed of elastomers such as Viton®, available from the Dupont Corporation, or generic ethylenepropylenediene monomer or similar elastomeric materials.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

What is claimed is:

1. A sealable container for containing wafers, the wafer container comprising:

a front opening wafer enclosure having a housing;

a door with an exterior surface and an interior surface, a portion of the interior surface of the door adapted to contact the housing upon sealing the wafer enclosure;

a first groove disposed about a perimeter of the interior surface of the door;

a second groove disposed adjacent to the first groove and spaced laterally from the perimeter of the door, the first and second grooves adapted to be separated by a support member disposed between the grooves; and an elastomeric seal member having a first portion adapted to be frictionally inserted into the second groove and extend around the door and having a second portion adapted to be disposed over the support member and over the first groove, wherein the second portion of the seal member is adapted to be deflected into the first groove upon sealing the wafer enclosure housing with the door.

2. The wafer container of claim 1, wherein the support member includes a plurality of protruding members that are adapted to engage with a plurality of corresponding apertures in the seal member such that lateral movement of the seal member is inhibited.

3. The wafer container of claim 2, wherein the protruding members include at least one of the group consisting of posts and flanges that protrude up from the interior surface of the door.

4. The wafer container of claim 1, wherein the second portion of the seal member is longer than the first portion and adapted to be cantilevered from the first portion.

5. The wafer container of claim 4, wherein the seal member is L-shaped, the second portion of the seal member configured to be longer than the first portion of the seal member.

6. The wafer container of claim 4, wherein the second portion of the seal member includes a head portion spaced laterally from the first portion of the seal member and is adapted to form a hermetic seal when the door and the wafer enclosure housing are engaged.

7. The wafer container of claim 1, wherein the seal member is configured to be recessed in at least one of the first or the second groove from a circumferential surface of the door.

8. The wafer container of claim 7, wherein the seal member includes an upper surface that is substantially co-planar with the interior surface of the door.

9. The wafer container of claim 1, wherein the support member laterally extends beyond half of the length of the second portion of the seal member.

10. A wafer container comprising:

a front opening wafer enclosure;

a wafer enclosure door with an interior surface, an exterior surface and a first groove disposed about a perimeter of the interior surface of the door;

a wafer enclosure seal member, wherein the wafer enclosure seal member comprises;

a first portion adapted to be frictionally inserted into a second groove, the second groove disposed adjacent to the first groove and spaced from the perimeter of the door; and a second portion adapted to be disposed over the first groove and disposed over a support member that separates the first and second grooves, wherein the second portion of the seal member is adapted to be deflected into the first groove upon sealing a wafer enclosure housing with the door.

11. The wafer container of claim 10, further including a plurality of apertures adapted to be engaged with a plurality of corresponding protruding members that protrude from the support member such that lateral movement from the door of the seal member is inhibited.

12. The wafer container of claim 11, wherein the protruding members include at least one of the group consisting of posts and flanges.

13. The wafer container of claim 11, wherein the apertures are elongated and co-linear with the second groove.

14. The wafer container of claim 10, wherein the second portion of the seal member is longer than the first portion and adapted to be cantilevered from the first portion.

15. The wafer container of claim 14, wherein the second portion of the seal member includes a head portion spaced laterally from the first portion.

16. The wafer container of claim 10, wherein a top surface of the first portion of the seal member is not co-linear with a top surface of the second portion of the seal member.

17. A wafer enclosure comprising:

a housing adapted for carrying a plurality of wafers; and a door adapted to sealingly engage the housing and including a wafer enclosure sealing arrangement, the wafer enclosure sealing arrangement including:

the first groove disposed about a perimeter of an interior surface of the door;

a second groove disposed adjacent to the first groove and spaced laterally from the perimeter of the door, the first and second grooves adapted to be separated by a support member disposed between the grooves; and an elastomeric seal member having a first portion adapted to be frictionally inserted into the second grove and extend around the door and having a second portion adapted to be disposed over the support member and over the first groove, wherein the second portion of the seal member is adapted to be deflected into the first groove upon sealing the wafer enclosure with the door.

18. The wafer enclosure of claim 17, wherein the support member includes a plurality of posts that are adapted to be engaged with a plurality of corresponding of apertures in the seal member such that lateral movement of the seal member is inhibited.

19. The wafer enclosure of claim 18, wherein the seal member is L-shaped, the second portion of the seal member configured to be cantilevered longer than the first portion of the seal member.

20. The wafer enclosure of claim 17 wherein the seal member further comprises a head portion disposed on the second portion and spaced laterally from the first portion.

* * * * *